United States Patent
Hölzig et al.

(10) Patent No.: US 7,585,772 B2
(45) Date of Patent: Sep. 8, 2009

(54) PROCESS FOR SMOOTHENING III-N SUBSTRATES

(75) Inventors: Stefan Hölzig, Freiberg (DE); Gunnar Leibiger, Freiberg (DE)

(73) Assignee: Freiberger Compound Materials GmbH, Freiberg (DE)

( * ) Notice: Subject to any disclaimer, the term of this patent is extended or adjusted under 35 U.S.C. 154(b) by 137 days.

(21) Appl. No.: 11/878,713

(22) Filed: Jul. 26, 2007

(65) Prior Publication Data

US 2008/0023800 A1 Jan. 31, 2008

Related U.S. Application Data

(63) Continuation of application No. PCT/EP2006/007413, filed on Jul. 26, 2006.

(60) Provisional application No. 60/833,280, filed on Jul. 26, 2006.

(51) Int. Cl.
H01L 21/302 (2006.01)
(52) U.S. Cl. .................... 438/692; 216/89
(58) Field of Classification Search ................ 438/690, 438/691, 692, 693; 216/88, 89; 252/79.1
See application file for complete search history.

(56) References Cited

U.S. PATENT DOCUMENTS

| | | | |
|---|---|---|---|
| 5,902,393 A | 5/1999 | Nido et al. | |
| 5,981,415 A * | 11/1999 | Waku et al. | 501/80 |
| 6,177,292 B1 | 1/2001 | Hong et al. | |
| 6,211,089 B1 | 4/2001 | Kim et al. | |
| 6,399,500 B1 | 6/2002 | Porowski et al. | |
| 6,472,690 B1 | 10/2002 | Manabe et al. | |
| 6,482,758 B1 * | 11/2002 | Weber et al. | 501/41 |
| 6,555,452 B2 | 4/2003 | Nikolaev et al. | |
| 6,596,079 B1 | 7/2003 | Vaudo et al. | |
| 6,616,757 B1 | 9/2003 | Melnik et al. | |

(Continued)

FOREIGN PATENT DOCUMENTS

EP  1 184 489 A2  3/2002

(Continued)

OTHER PUBLICATIONS

J. L. Weyher et al., "Chemical polishing of bulk and epitaxial GaN", Journal of Crystal Growth 182, 1997, pp. 17-22.

(Continued)

*Primary Examiner*—Kin-Chan Chen
(74) *Attorney, Agent, or Firm*—Foley & Lardner LLP

(57) ABSTRACT

A process for preparing smoothened III-N, in particular smoothened III-N substrate or III-N template, wherein III denotes at least one element of group III of the Periodic System, selected from Al, Ga and In, utilizes a smoothening agent comprising cubic boron nitride abrasive particles. The process provides large-sized III-N substrates or III-N templates having diameters of at least 40 mm, at a homogeneity of very low surface roughness over the whole substrate or wafer surface. In a mapping of the wafer surface with a white light interferometer, the standard deviation of the rms-values is 5% or lower, with a very good crystal quality at the surface or in surface-near regions, measurable, e.g., by means of rocking curve mappings and/or micro-Raman mappings.

12 Claims, 1 Drawing Sheet

U.S. PATENT DOCUMENTS

| | | | |
|---|---|---|---|
| 6,669,749 B1* | 12/2003 | Rosenflanz et al. | 51/309 |
| 6,936,357 B2 | 8/2005 | Melnik et al. | |
| 6,951,695 B2 | 10/2005 | Xu et al. | |
| 2002/0028565 A1 | 3/2002 | Nikolaev et al. | |
| 2002/0170484 A1 | 11/2002 | Katamine et al. | |
| 2002/0185054 A1 | 12/2002 | Xu et al. | |
| 2005/0009310 A1 | 1/2005 | Vaudo et al. | |
| 2005/0164044 A1 | 7/2005 | Melnik et al. | |
| 2005/0191775 A1* | 9/2005 | Toda et al. | 438/22 |
| 2005/0212001 A1 | 9/2005 | Melnik et al. | |
| 2006/0283840 A1 | 12/2006 | Matsumoto | |
| 2007/0261633 A1* | 11/2007 | Tanaka | 117/952 |

FOREIGN PATENT DOCUMENTS

| | | |
|---|---|---|
| EP | 1 271 627 A2 | 1/2003 |
| EP | 1 431 426 A2 | 6/2004 |
| JP | 3-279528 A | 12/1991 |
| JP | 2000-91234 A | 3/2000 |
| JP | 2001-85373 A | 3/2001 |
| JP | 2004-311575 A | 11/2004 |
| JP | 2006-60074 A | 3/2006 |
| WO | WO 97/31140 | 8/1997 |
| WO | WO 00/70129 | 11/2000 |
| WO | WO 01/68955 A1 | 9/2001 |
| WO | WO 03/035945 A2 | 5/2003 |
| WO | WO 2006/075527 A1 | 7/2006 |

OTHER PUBLICATIONS

J. L. Weyher et al., "Defects in GaN single crystals and homoepitaxial structures", Journal of Crystal Growth 281, 2005, pp. 135-142.

C. R. Miskys et al., "MOCVD-Epitaxy on Free-Standing HVPE-GaN Substrates", Phys. Stat. Sol. (a) 176, 1999, pp. 443-446.

P. R. Tavernier et al., "Chemical Mechanical Polishing of Gallium Nitride", Electrochemical and Solid-State Letters, 5 (8), 2002, pp. G61-G64.

F. Karouta et al., "Final Polishing of Ga-Polar GaN Substrates using Reactive Ion Etching", Journal of Electronic Materials, vol. 26, No. 12, 1999, pp. 1448-1451.

S. Porowski, "Near Defect Free GaN Substrates", MRS Internet, J. Nitride Semicond. Res 451, 1999, G1.3.

M. Kelly et al., "Large Free-Standing GaN Substrates by Hydride Vapor Phase Epitaxy and Laser-Induced Liftoff", Japanese Journal of Applied Physics, vol. 38, 1999, pp. L217-L219.

K. Motoki et al., "Preparation of Large Freestanding GaN Substrates by Hydride Vapor Phase Epitaxy Using GaAs as a Starting Substrate", Japanese Journal of Applied Physics, vol. 40, 2001, pp. L140-L143.

Y. Melnik et al., "Properties of Free-standing GAN Bulk Crystals Grown by HVPE", Materials Research Society Symposium Proceedings, vol. 482, 1998, pp. 269-274.

H. Kim et al., "Preparation of 30X30 $mm^2$ Free-Standing GaN Wafer by Mechanical Liftoff and Optical Properties in The Backside of The Free GaN by Cathodoluminescence", Materials Research Society Symposium Proceedings, vol. 639, 2001, pp. G6.51.1-G6.51.6.

A. Fomin et al., "Properties of Si-Doped GaN Layers Grown by HVPE", Phys. Stat. Sol. (a) 188, No. 1, 2001, pp. 433-437.

A. Kasic et al., "Micro-Raman scattering profiling studies on HVPE-grown free-standing GaN", Phys. Stat. Sol. (a) 201, No. 12, 2004, pp. 2773-2776.

J. Niklas et al., "GaAs wafer mapping by microwave-detected photoconductivity", Materials Science & Engineering B80, 2001, pp. 206-209.

E. Schubert et al., "Optical properties of Si-doped GaN", Applied Physics Letter, 71 (7), 1997, pp. 921-923.

A. Usikov et al., "Lattice constant variation in GaN:Si layers grown by HVPE", Materials Research Society Symposium Proceedings, vol. 743, 2003, pp. L3.41.1-L3.41.6.

M. Yoon et al., "Free Carrier Concentration Gradient along the $c$-Axis of a Freestanding Si-doped GaN Single Crystal", Japanese Journal of Applied Physics, vol. 44, No. 2, 2005, pp. 828-831.

* cited by examiner

PROCESS FOR SMOOTHENING III-N SUBSTRATES

CROSS-REFERENCE TO RELATED PATENT APPLICATIONS

This application claims priority from Provisional Application U.S. Application 60/833,280, filed Jul. 26, 2006, the entire contents of which, including the specification, drawings, claims and abstract, are incorporated herein by reference. This application is also a continuation of International Patent Application PCT/EP2006/007413, filed Jul. 26, 2006, the entire contents of which, including the specification, drawings, claims and abstract, are incorporated herein by reference.

BACKGROUND OF THE INVENTION

The present invention relates to a process for smoothening, in particular for lapping and/or polishing materials comprising III-N surfaces, particularly III-N substrates or III-N templates comprising foreign substrates. Here, N means nitrogen and III means at least one element of the III. Main group of the Period System, selected from aluminum, gallium and indium (in the following partially abbreviated by (Al,Ga,In)). The invention further relates to III-N substrates and foreign substrate-comprising III-N templates. These III-N substrates and III-N templates are well suited as substrates or templates for manufacturing electronic devices/components.

For a long time, mechanical and/or chemical-mechanical polishing have been commercially used standard processes for planarizing and smoothening the surfaces of semiconductor substrates, such as of GaAs. To this end, smooth and planar as well as defect-free substrate surfaces are prerequisites for subsequent epitaxy or lithography steps for the manufacture of micro-electronic or opto-electronic devices/components. Known polishing processes for GaN-substrates having c-plane orientation differ due to different chemical stabilities for the Ga-polar ([0001]-orientation) and the N-polar ([000$\bar{1}$]-orientation) surface, respectively. Thus, the Ga-surface (i.e. [0001]) is almost chemically inert at room temperature, whereas the N-surface (i.e. [000$\bar{1}$]) is affected by various etchants (for example aqueous NaOH or KOH solutions). In addition, the Ga-surface is significantly harder than the N-surface.

Weyher et al. (Chemical Polishing of Bulk and Epitaxial GaN", J. Cryst. Growth 182 (1997) 17) presented a polishing process for polishing the N-surface (remark: a correlation of the results with the N- or the Ga-surface respectively was made later on, see e.g. J. Weyher et al. "Defects in GaN Single Crystals and Homoepitaxial Structures", J. Cryst. Growth 281 (205, 135), consisting of a step of mechanically polishing by using diamond slurry and a subsequent step of CMP by using an aqueous solution of KOH and/or NaOH. The Ga-surface, however, for which the said process is not applicable, is of unequally higher importance for the subsequent epitaxy (see e.g. Miskys et al., "MOCVD-Epitaxy on Free-Standing HVDE-GaN-Substrates", Fris. phys. stat. sol. (a) 176 (1999, 443). Weyher et al. did not indicate the hard material used for the abrasive particles.

The process described by Porowsky et al. ("Mechano-Chemical Polishing of Crystals and Epitaxial Layers of GaN and $Ga_{1-x-y}Al_xIn_yN$", U.S. Pat. No. 6,399,500) corresponds to the aforementioned prior art of Weyher et al. There is no explicit hint to the polarity of the polished surface. The hard material used for the abrasive particles is not indicated.

Tavernier et al. ("Chemical Mechanical Polishing of Gallium Nitride", Electrochemical and Solid-State Letters 5 (2002) G61) report about a CMP-process by using silicon oxide as abrasive particles, which process is also successfully applicable only for the N-surface of GaN, but is unsuited for the Ga-surface.

Karouta et al. ("Final Polishing of Ga-Polar GaN-Substrates using Reactive Ion Etching", Journal of Electronic Materials 28 (1999) 1448) presented a process for polishing the Ga-surface of GaN by means of reactive ion etching (RIE), wherein the crystals have been pre-treated with diamond slurry in a previous mechanical polishing step. The RIE-process further has the disadvantage that it is very cumbersome, and that furthermore the ion irradiation leads to a damaging of the crystal lattice in the surface-near region.

Kim et al. ("Method for Fabrication GaN-Substrate", U.S. Pat. No. 6,211,089) report on a process for polishing GaN-substrates, consisting of mechanical polishing steps with diamond slurry and boron carbide plates, wherein also, for abolishing polishing damages, a RIE-process with the aforementioned disadvantages as well as an additional terminal annealing step are used.

Xu et al. ("High Surface Quality GaN Wafer and Method of Fabricating Same", U.S. Pat. No. 6,951,695) describe a method for chemical-mechanical polishing, inter alia of $Al_x$-$Ga_yIn_z$-terminated (0001)-$Al_xGa_yIn_z$N-surfaces by using abrasive silicon oxide or aluminum oxide particles in acid or basic solution. From the description, it is further derivable that the structural damages in the crystal, which are caused by the preferred use of diamond slurry (or, alternatively, silicon carbide, boron carbide or aluminum oxide slurry) in the mechanical polishing which precedes the CMP-step, as well as by the CMP-process, are diminished or minimized by a subsequent wet-chemical etching step, for example using 180° C. hot phosphoric acid, which is technologically laborious.

Kato et al. ("Polishing Composition for Semiconductor Substrate and Method of Manufacturing Semiconductor Substrate Using Same", JP application 2003-100373) describe a slurry composition merely for polishing GaN, consisting of a mixture of hard (e.g. diamond) and soft (e.g. silicon oxide) abrasive particles. In the described polishing process, the slurry is maintained at a temperature between 10° C. and 80° C. Polishing at high temperature is technologically very laborious.

SUMMARY OF THE INVENTION

The object underlying the present invention is to provide a process for smoothening, particularly for polishing III-N surfaces, which on the one hand is successfully applicable also to a chemically almost inert surface of the III-N crystal [i.e. the (Al,Ga,In)-surface] and on the other hand damages the crystal lattice as low as possible, in order to thus be capable of providing a III-N substrate and a III-N template having improved surface structure, respectively.

The object is solved by a process for preparing of a smoothened surface of a material comprising, at the surface to be smoothened, a III-N compound, wherein cubic boron nitride (cBN) is used as abrasive particle material. The smoothening process may particularly include a lapping process and/or above all a polishing process of a surface of a III-N material. It was surprisingly found that specifically with the particle material cBN, an effect on the chemically almost inert and hard (Al,Ga,In)-surface of (Al,Ga,In)N is achieved on the one hand, but a damaging of the crystal lattice is reduced on the other hand. The reason for this is assumed to be that cubic boron nitride (cBN) has a hardness optimal for polishing specifically III-N material, by which hardness the opposite effects are harmonized best. This cBN material is harder than, for example, silicon oxide such that, when polishing, a substantial abrasion can be achieved also on the chemically almost inert and hard (Al,Ga,In)-surface. On the other hand, it is however less hard than diamond, which reduces a damaging of the crystal lattice.

It is to be noted that Keizo et al. in JP-A-2001-085373 describe a CMP-polishing liquid which contains, as abrasive particle material, for example silicon oxide, silicon nitride, aluminum, zirconium oxide, cerium oxide, boron nitride, diamond, hard carbon, etc., but for polishing Si wafers. The aim of JP-A-2001-085373 is to wet abrasive particles with an organic surfactant in order to be able to disperse the particles in water easily and to obtain a higher ratio of polishing rate of silicon oxide film to silicon nitride film. Thus, a hint for solving the specific problems when polishing III-N surfaces can not be derived from this disclosure.

The smoothening according to the invention with cubic boron nitride (cBN) as abrasive particle material is carried out preferably towards the III-polar (e.g. Ga-polar) surface [0001] of the III-N material, because the effects of the invention bring about particular advantages with respect to this chemically inert surface. The smoothening according to the invention may however be carried out, alternatively or additionally, with respect to the N-polar surface [000$\bar{1}$] of the III-N material.

A slurry particularly suitable for polishing is a water-soluble suspension containing additionally one or more substances selected from the group consisting of ammonia, potassium hydroxide, sodium hydroxide, hydrogen peroxide and organic base.

In a preferred embodiment, a free-standing III-N substrate or a III-N template is lapped and/or polished, which template comprises a foreign substrate, an upper III-N layer and optionally one or more intermediate layer(s) formed from III-N or another material. The material of the foreign substrate is preferably selected from the group consisting of sapphire, silicon carbide, gallium nitride, aluminum nitride, gallium arsenide, zinc oxide, silicon, lithium aluminate and lithium gallate.

In order to further improve crystal quality, particularly at the surface in a preferred embodiment, a surface of a free-standing III-N substrate having an exactly oriented c-, a-, m- or r-plane, or a plane which has a misorientation of 0.1-30° towards a c-, a-, m- or r-plane is lapped and/or polished. Is it of further advantage if a surface is lapped and/or polished having an exactly oriented III-polar (e.g. Ga-polar) c-plane, or a plane which has a misorientation of 0.1-1° towards an exactly oriented III-polar (e.g. Ga-polar) c-plane.

Suitable mean grain sizes of the cBN-particle material for example lie in the range of 0.1 to 20 μm, preferably in the range of 0.5 to 10 μm and further preferably in the range of 1 to 6 μm.

The efficacy and the effects of the polishing process can be further improved, if the polishing process comprises multiple steps, in particular 2, 3, 4, 5 or 6 polishing steps, in which the mean grain size of the cubic boron nitride particles decrease in respective subsequent steps. A particular good combination of polishing steps consists in that, in two and preferably three consecutive steps, the mean grain size of the cBN is above 4 to 7 μm ($1^{st}$ step), 2 to below 4 μm ($2^{nd}$ step) and 0.5 to below 2 μm (optionally $3^{rd}$ step), respectively, particularly if the mean grain size is about 6 μm, about 3 μm and about 1 μm, respectively, wherein the expression "about" means a tolerance of ±0.5 μm.

It is further preferred to carry out a lapping process in advance of the polishing process. It is advantageous to use cubic boron nitride as lapping agent also in the lapping process.

By means of using the specifically selected smoothening agent cBN, it is possible to achieve, even with large-sized III-N substrates or III-N templates having diameters of at least 40 mm, a unique combination of per se opposite properties, namely to combine an excellent smoothening, including an extremely good homogeneity of the surface roughness, with a highly preserved crystal quality due to a minor, virtually insignificant crystal damaging. In particular the homogeneity of the extremely low surface roughness over the whole substrate or wafer surface is a measure for the combination of properties achieved by the invention. Thus, the rms value of the surface roughness and particularly a homogenous distribution of the rms value over the whole wafer surface (except for a margin of e.g. 5 mm) according to the invention serves as a significant parameter, which is measurable for example by mapping the wafer surface by means of a white light interferometer, wherein the standard deviation of the rms values is a measure for the homogeneity of the surface roughness. According to the invention, large-sized III-N substrates or III-N templates are provided, where in a mapping on smoothened surfaces by means of white light interferometry, the standard aviation of the rms values is 5% or lower.

For example, the aforementioned publication of Miskys et al. serves a comparison for the importance of the inventive homogeneity of the surface roughness, as indicated according to the invention by the homogenous distribution of the rms-value over the wafer surface. According to the prior art even after a laborious polishing process towards the Ga-polar surface of the GaN-layer, which included 4 polishing steps of ten minutes with 15, 7, 3 and 0.25 sized diamond particles and another long polishing step with super-fine polishing material (0.04 μm in size), in spite of otherwise smooth surface, microscopic scratches remained on the polished surface, which then acted as primary nucleation sites of the GaN growth and generated noticeable detectable surface defects after the epitaxial growth above these scratch locations.

As a measure for the concurrent excellent crystal quality, in particular measurements from rocking curve mappings and/or micro-Raman mappings are suitable. Thus, with the free-standing III-N substrate and the III-N template according to the invention in a rocking curve mapping on the surface parallel to the growth plane as obtained by the inventive smoothening process, the standard deviation of the measured full-width at half maximum (half-width) is 5% or lower, preferably 3% or lower and further preferably 2% or lower. Alternatively, or concurrently, in a micro-Raman mapping with the free-standing III-N substrate and the III-N template according to the invention on the surface, parallel to the growth plane, as obtained by the inventive smoothening process, the standard deviation of the measured full-width at half maximum (half-width) of the $E_2$-phonon is 5% or lower, preferably 3% or lower and further preferably 2% or lower.

The standard deviation may be determined by performing respective rocking curve mapping measurements or micro-Raman measurements at a plurality of, e.g., 100 measurement points, forming the mean value of the full-widths at half maximum of all measurements, and determining the standard deviation relative to this mean value by usual statistical evaluation.

According to the invention, III-N substrates or III-N templates having diameters of at least 2 inch (ca. 5 cm), at least 3 inch (ca. 7.6 cm) or at least 4 inch (ca. 10 cm) or more can be advantageously produced.

According to a preferred use of the smoothening process of the invention towards the III-polar (e.g. Ga-polar) surface, III-N substrates or III-N templates are preferably produced according to the invention, wherein the parameters described above with respect to white light interferometer mapping, rocking curve mapping and/or micro-Raman mapping are applicable/valid with respect to the III-polar (e.g. Ga-polar) surface. More preferably, the said parameters however are valid/applicable to both surfaces, that is to the III-(e.g. Ga-) as well as the N-polar surface, respectively.

In the above definitions, N means nitrogen and III means at least one element of group III of the periodic system of elements. The III-element should be selected from the group of elements consisting of Al, Ga and In, alone or combination. A corresponding general formula thus is $Al_xGa_yIn_zN$, wherein $0 \leq x \leq 1$, $0 \leq y \leq 1$, $0 \leq z \leq 1$ and $x+y+z=1$. Examples for possible III-N compounds are quaternary compounds such as (Al,Ga,In)N, ternary compounds such as (Al,Ga)N, (Ga,In)N and (Al,In)N, or binary compounds such as GaN or AlN. Among the selected elements of the III. group as exemplified the preceding brackets, all conceivable atomic ratios are possible, i.e. from 0 to 100 atom-% for the respective element (e.g. (Al, Ga)N=$Al_xGa_{1-x}N$, wherein $0 \leq x \leq 1$). (Al, Ga)N and GaN are particularly preferred. The following description of an example is applicable not only to the III-N compound example indicated there, but also to all possible III-N compounds. Besides the III-N substrates the invention can be favourably applied also to a III-N template, which comprises a foreign substrate as mentioned above, an upper III-N layer and optionally one or more intermediate layer(s), which is (are) formed of III-N or another material, and whose III-N surface is correspondingly smoothened. The compositions of III-N for thin and thick layers, substrates and templates may be chosen independently. The compositions may be the same or different. The invention is particularly suitably applicable to III-N-layers, -substrates and -templates that have been prepared by an epitaxy process, preferably by means of vapour phase epitaxy such as by MOVPE and, above all, by HVPE. The III-N compound is advantageously crystalline, and, above all, single-crystalline.

Further objects, features and advantages of the present invention will become apparent from the detailed description of preferred embodiments that follows, when considered together with the accompanying figures of drawing.

BRIEF DESCRIPTION OF THE DRAWINGS

The invention will subsequently be described in more detail by means of preferred embodiments and examples, which however are for illustration only and shall not be understood in a limiting manner, by referring to the annexed drawings, wherein.

DETAILED DESCRIPTION OF THE PREFERRED EMBODIMENTS

Figure 1:
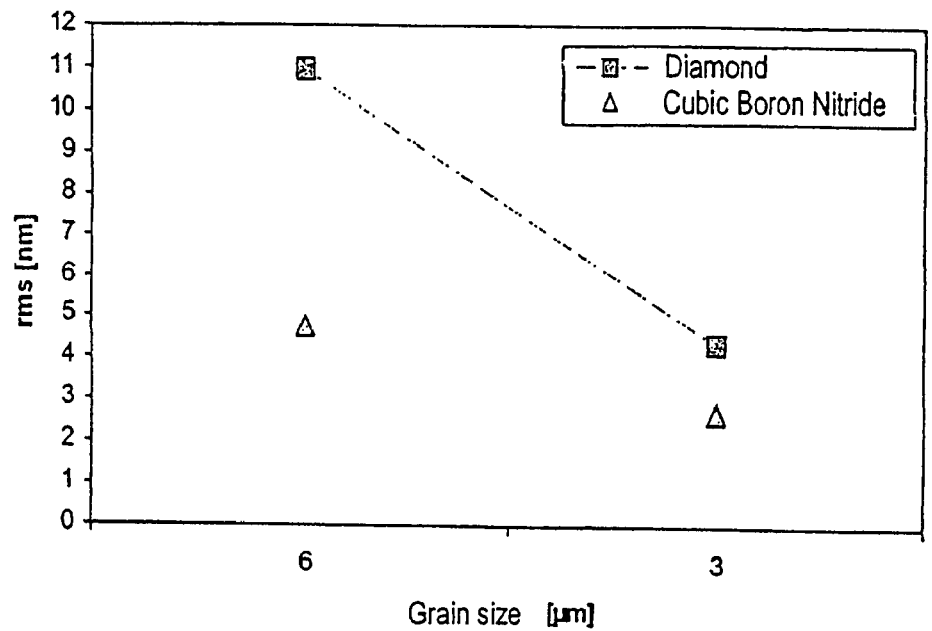
FIG. 1 shows a comparison of the surface roughness (rms) value of a GaN-wafer after mechanically polishing with cBN-containing slurry (invention) and with diamond-containing slurry (comparison)

The polishing process can be carried out on a commercially ordinary polishing machine, wherein, in a possible embodiment, the support plate and the wafer(s) fixed thereon are rotated and the wafer(s) additionally perform an oscillatory movement in the radial direction during polishing. The polishing plates, having polishing cloth fixed thereon, and the wafer(s) are compressed during polishing, wherein the slurry is dropped onto the polishing cloth.

The slurry is a dispersion of an aqueous basis having cBN as abrasive particles. In order to obtain optimal smooth surfaces optimally, multiple polishing steps are carried out, wherein the mean grain size of cBN decreases from one to the next polishing step. A possible gradation, for example, are mean grain sizes of 6 μm, 3 μm and 1 μm in three subsequent polishing steps.

The polishing cloth may be optionally conditionized during or, alternatively, before and inbetween the polishing runs (for example with "DiaGrid" Pad conditioner of Rohm and Haas, Feldkirchen, Germany).

The (Al,Ga,In)N-wafers or -templates to be polished may have been produced by various known vapour phase or solution growth methods. Directly after the growth step, further mechanical treatment steps (one or more), selected from the steps indicated in the following, may precede the polishing process:

round grinding,
grinding of flats and/or notches,
wire sawing,
etch rounding,
lapping, wherein the last-mentioned lapping step may consist of multiple consecutive partial steps with decreasing mean grain sizes of the lapping agent. For example, silicon carbide, diamond or cubic boron nitride may be used as a lapping agent.

For mapping the wafer surface with a white light interferometer, wherein the standard deviation of the rms-value may serve as a measure for the homogeneity of a surface roughness, the wafer surface may, for example, be divided in a raster having respective maximal 5 mm distances orthogonal to each other. Taking account of an edge margin of 5 mm, a surface scan can now be carried out in each raster, wherein the scanning region should be at least 1% of the raster size. The rms-values may be measured in a standardized manner with a commercially available white light interferometer by using white light.

The crystal quality of the treated surface can be technically measured, for example by means of X-ray diffraction, e.g. as a spacial distribution of absolute values and/or of full-widths at half maximum (half-widths) of X-ray diffraction curves, corresponding to the diffraction at specific lattice planes. The homogeneity of the crystal quality in the growth plane or face may be ascertained for example by means of so-called rocking curve mappings (recording of Ω-scans at different locations of a sample surface), which have been recorded in a plane parallel to the growth plane or face. In the case of a growth in the [0001] direction, for example the reflection of the (0002) lattice planes can be used for the Ω-scans. The homogeneity of the crystal quality in the growth direction may be determined by means of the standard deviation of the mean values of the full-widths at half maximum (half-widths) of the (0002) Ω-scans of individualized substrates, which have been obtained from the corresponding bulk crystal.

A second method for the determination of the homogeneity of the crystal quality are Raman-mappings. Thus, for example the standard deviations of frequency and full-widths at half maximum (half-widths) of a $E_2$-phonon in a scan of a plane parallel to the growth plane is a measure for the homogeneity of the crystal quality parallel to the growth plane.

The micro-Raman measurements may be carried out with a laser excitation wavelength of 532 nm (frequency doubled Nd:YAG laser), an excitation power of 3 mW (e.g. with a Labram800HR-spectrometer of Jobin Yvon), wherein the laser can be focussed onto the sample by means of microscopic optics to a beam diameter of ~1 µm. When scanning on the surface, the increment in x- and y-direction, for example, is ~2.5 mm. A suitable margin is chosen, for example, 2 mm from the wafer edge. When scanning on the wafer slit face lying perpendicular to the surface, the increment in z-direction is ~10 µm. Frequency and fullwidth at half maximum (half-width) of the $E_2$-phonon is determined by Lorentz line form analysis.

Example

As a polishing machine, a PT 350 Premium of the company I-B-S Fertigungs-und Vertriebs-GmbH was used. GaN-wafer having (0001)-orientation had been adhered by means of Thermowax with the N-polar backside on a heated support plate, wherein the latter was cooled again to room temperature until the process started. The polishing cloth, which was a medium hard cloth based on polyurethane (Rohm and Haas SUBA IV) was adhered onto the polishing plate. The cBN-slurry (CBN Slurry W69S1 6 µm/3 µm HVY, dealer Dieter Manfred Böduel, Wittenberg, Germany) was dropped at a flow rate of ~5 ml/min. The use of the cBN-slurry was accomplished in two mutually independent polishing steps, using 6 µm and 3 µm sized cBN particles, respectively (mean particle sizes, respectively). Polishing plate and sample were rotated with ~30 min$^{-1}$ and ~20 min$^{-1}$, respectively. In addition, the sample, fixed out-of-center, oscillated in radial direction. The compression during polishing was ~1.700 g/cm$^2$.

The Ga-polar surfaces of the thus polished wafers were compared with the Ga-polar surfaces of wafers, which were polished by the same conditions except for using diamond slurry (mean grain sizes of 6 µm and 3 µm), by means of a commercial white light interferometer (Zygo New View). The performance of the measurement is described in more detail below.

FIG. 1 shows a comparison of a mean surface roughness (rms-value) after the mechanical polishing with cBN slurry and diamond slurry.

As can be gathered from FIG. 1, significantly lower surface roughnesses, and, above all, a lower standard deviation of the absolute rms-values with respect to the mean value are obtained in each polishing step with the cBN slurry in comparison with the diamond slurry. Here, the rms-values were measured on an area of 350×260 µm$^2$.

Figure 2:
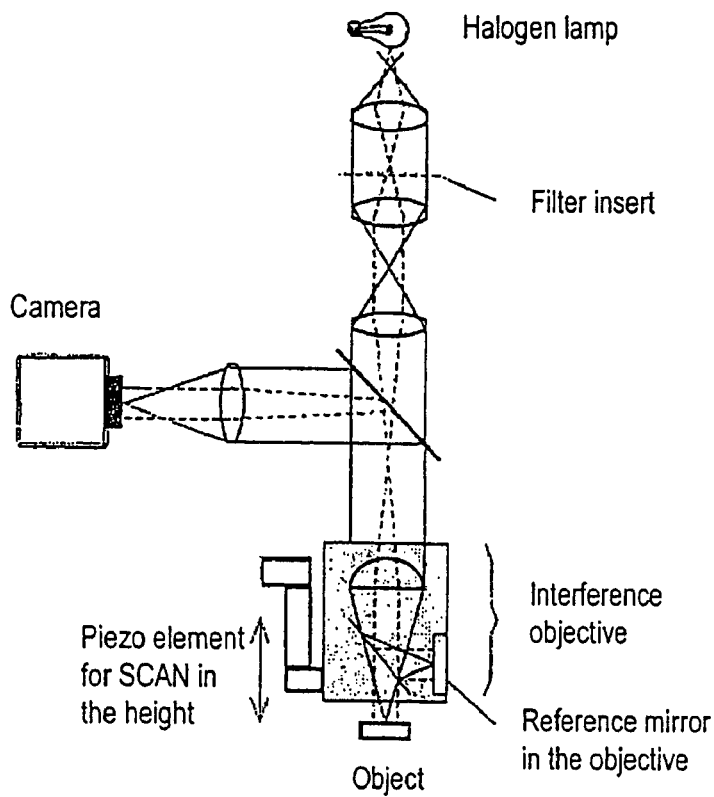
FIG. 2 shows a principle for a surface investigation which is suitable for the measurement of rms-values by means of white light interferometry.

Analysis of the GaN-surfaces, specifically for measuring the roughness, including standard measurement of rms-values by means of a commercial white light interferometer (Zygo New View):

A principle of a white light interferometer is shown in FIG. 2 (source: zygoLOT). The measurement principle is based on a combination of a microscope with an interferometer. Here, light of a white light source is divided in two beams, wherein one partial beam is reflected at a reference mirror, whereas the other is reflected at the sample. Subsequently, both partial beams are super-imposed. Owing to the topography of the sample surface, different optical path lengths of both beams and thus an interference pattern are generated, whose analysis is performed by means of frequency domain analysis (FDA). The use of white light enables analysis of interferences of multiple light wavelengths. The relative position between the reference mirror and the sample surface may be displaced by means of a piezo actuator.

From the correlation of the exactly determined path variation between mirror and sample by means of the analysis of the interference signal, vertical accuracies up to 0.1 nm are obtained. A sample reflectivity of 0.4% is sufficient for the measurement, so that even weak reflecting surfaces can be measured.

Micro-Raman measurements for the determination of the frequency and the full-width at half maximum (half-width) of the E2-phonon may be carried out by means of a commercial Labram800HR spectrometer of JobinYvon as follows:

laser excitation wavelength 532 nm (frequency-doubled Nd:YAG-laser), excitation power 3 mW, focussing of the laser line by means of microscopic optics to a beam diameter of ~1 µm onto the sample.

The spectrometer is additionally calibrated by means of Ne-plasma lines. The measurements are carried out in back-scattering geometry, wherein the polarizer settings are chosen such that $E_2$-phonons can be detected [scanning on surface: z(y x/y)–z; scanning on slit face: y(x x)–y]. When scanning on the surface, the increment in x- and y-direction is ~2.5 mm. The margin from the wafer edge is 2 mm. When scanning on the wafer slit face lying perpendicular to the surface, the increment in z-direction is ~10 µm. Frequency and full-width at half maximum (half-width) of $E_2$-phonon is determined by Lorentz line form analysis.

The foregoing description of preferred embodiments of the invention has been presented for purposes of illustration and description only. It is not intended to be exhaustive or to limit the invention to the precise form disclosed, and modifications and variations are possible and/or would be apparent in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto and that the claims encompass all embodiments of the invention, including the disclosed embodiments and their equivalents.

What is claimed is:

1. A process for preparing a smoothened surface of a III-N compound material, comprising:

polishing the surface to be smoothened of a material which comprises, at said surface, a III-N compound, wherein III denotes at least one element of group III of the Periodic System, selected from Al, Ga and In, with a slurry in the form of an aqueous suspension comprising cubic boron nitride abrasive particles;

wherein the polishing includes multiple consecutive polishing steps wherein said abrasive particles have a decreasing consecutive mean grain size in at least one subsequent step.

2. The process according to claim 1, wherein the slurry contains at least one substance, selected from the group consisting of ammonia, potassium hydroxide, sodium hydroxide, hydrogen peroxide and an organic base.

3. The process according to claim 1, wherein said material is selected from the group consisting of a free-standing III-N substrate and a III-N template, wherein the III-N template comprises a foreign substrate, an upper III-layer and optionally at least one intermediate layer formed of III-N or another material.

4. The process according to claim 3, further comprising subjecting the surface to be smoothened to a lapping process with a slurry comprising cubic boron nitride abrasive particles.

5. The process according to claim 3, wherein said material of the foreign substrate is selected from the group consisting of sapphire, silicon carbide, gallium nitride, aluminum nitride, gallium arsenide, zinc oxide, silicon, lithium aluminate, and lithium gallate.

6. The process according to claim 3, wherein said freestanding III-N substrate or said III-N template, respectively, has a surface to be smoothened being defined by an exactly oriented c-, a-, m- or r-plane, or by a plane having a misorientation of 0.1-30° towards a c-, a-, m- or r-plane.

7. The process according to claim 3, wherein said freestanding III-N substrate or said III-N template, respectively, has a surface to be smoothened being defined by an exactly oriented III-polar c-plane, or a plane having a misorientation of 0.1-1° towards a III-polar c-plane.

8. The process according to claim 1, wherein, in three consecutive polishing steps, the abrasive particles have mean grain sizes in ranges of 4 to 7 μm, 2 to 4 μm and 0.5 to 2 μm, respectively.

9. The process according to claim 8, wherein, in said three consecutive polishing steps, the mean grain sizes are about 6 μm, about 3 μm and about 1 μm, respectively.

10. The process according to claim 1, further comprising a lapping process carried out before said polishing.

11. The process according to claim 10, wherein cubic boron nitride is used as a lapping agent.

12. The process according to claim 1, wherein the cubic boron nitride-containing slurry is applied towards a III-polar surface [0001] of the III-N material.

* * * * *